(12) United States Patent
Kemeny

(10) Patent No.: US 8,190,584 B1
(45) Date of Patent: May 29, 2012

(54) UTILIZING RECURSIVE APPLICATION OF A REVERSIBLE TRANSFORM WHICH INVOLVES LEXICOGRAPHIC ORDERING

(75) Inventor: John Kemeny, Westford, MA (US)

(73) Assignee: EMC Corporation, Hopkinton, MA (US)

( * ) Notice: Subject to any disclaimer, the term of this patent is extended or adjusted under 35 U.S.C. 154(b) by 323 days.

(21) Appl. No.: 12/567,988

(22) Filed: Sep. 28, 2009

(51) Int. Cl.
  *G06F 17/00* (2006.01)
(52) U.S. Cl. .............. 707/693; 341/50; 341/51; 341/60
(58) Field of Classification Search ............... 380/28, 380/29, 36, 37, 200, 201, 225; 382/100, 382/232, 244, 248, 250, 276; 708/200, 400, 708/401
See application file for complete search history.

(56) References Cited

U.S. PATENT DOCUMENTS

| | | | |
|---|---|---|---|
| 5,486,826 A * | 1/1996 | Remillard | 341/51 |
| 6,075,470 A | 6/2000 | Little et al. | |
| 6,400,289 B1 | 6/2002 | Banerji | |
| 6,661,839 B1 | 12/2003 | Ishida et al. | |
| 7,265,692 B2 | 9/2007 | Martin et al. | |
| 7,511,643 B2 | 3/2009 | Baraniuk et al. | |
| 7,630,394 B2 | 12/2009 | Matias et al. | |

OTHER PUBLICATIONS

M.Burrows and D.J. Wheeler, "A Block-sorting Lossless Data Compression Algorithm", SRC Research Report 124, Digital Sytems Research Center, May 10, 1994, 24 pages.
Josheph (Yossi) Gil and David Allen Scott, "A Bijective String Sorting Transform", Jul. 7, 2009, pp. 1-10.

* cited by examiner

*Primary Examiner* — Shahid Alam
*Assistant Examiner* — Jagdish Pandya
(74) *Attorney, Agent, or Firm* — BainwoodHuang

(57) ABSTRACT

An electronic device provides electronic access to a dataset representing meaningful information. The electronic device generates a first subset permutation based on a first subset of the dataset, and generates a second subset permutation based on a second subset of the dataset. Each subset of the dataset includes a series of data elements having a particular fixed bit-length. The first subset permutation includes a rearrangement of the series of data elements of the first subset. Similarly, the second subset permutation includes a rearrangement of the series of data elements of the second subset. The electronic device further forms an electronic aggregation based on the first subset permutation and the second subset permutation, and generates an aggregation permutation based on the electronic aggregation. The aggregation permutation includes a rearrangement of portions of the electronic aggregation. The meaningful information is fully recoverable from the aggregation permutation.

22 Claims, 8 Drawing Sheets

UTILIZING RECURSIVE APPLICATION OF A REVERSIBLE TRANSFORM WHICH INVOLVES LEXICOGRAPHIC ORDERING

BACKGROUND

Lossless data compression enables reconstruction of all of the original data from a compressed form of the data. During initial data compression, application of a reversible transform typically rearranges the original data into transformed data, and subsequent application of a compression algorithm compresses the transformed data to provide the compressed form of the data.

During data reconstruction, application of a decompression algorithm un-compresses the compressed form of the data to provide the transformed data. Next, application of the reversible transform (i.e., an inverse transform process) rearranges the transformed data back into the original data.

The Burrows-Wheeler Transform (BWT) is an example of a reversible transform which has been successfully applied as a first stage for compression of a data file (e.g., as a front-end to a bzip2 compression process). Along these lines, the file type extension (e.g., .txt, .utx, .jpg, etc.) initially identifies certain characteristics of the contents of the data file such as the true bit-length of the data contained within the data file (i.e., the actual bit-length of the characters/symbols/pixels/etc. within the data file). Once the true bit-length is known, the contents of the data file are correctly parsed into sequence based on the true bit-length for proper data transformation and compression. A description of the BWT is provided in a publication entitled "A Block-sorting Lossless Data Compression Algorithm" by M. Burrows and D. J. Wheeler, the teachings of which are hereby incorporated by reference in their entirety.

SUMMARY

Unfortunately, there are limitations to the above-described conventional application of the Burrows-Wheeler Transform (BWT). For example, the degree of character migration resulting from a conventional single application of the BWT to the contents of a data file may be somewhat low depending on the particular data. Additionally, BWT application typically requires upfront access to the entire data file or access to the file type extension in order to determine the true bit-length of the characters for proper parsing of the data file contents. However, in some situations, access to the entire data file and knowledge of the true bit-length of the characters is not available ahead of time (e.g., during transmission of individual portions of the data, when processing block storage, etc.).

In contrast to the above-described conventional single BWT application to a data file (i.e., the BWT is applied only once to the data), an improved technique involves recursive application of a reversible transform which uses lexicographic ordering. Such recursive application of the reversible transform (i.e., a first application of the reversible transform to an input to generate a partial transform result, and subsequent application of the reversible transform to the partial transform result) improves the rate of character migration and thus compression effectiveness. To achieve this effectiveness between applications of the transform, a permutation/shuffle-concatenation operation is performed which leads to the improved compression results. Furthermore, application of a set of different bit-length reversible transforms and a comparison of entropy results can enable identification of an optimal reversible transform thus alleviating the need to access to the entire data file or know the true bit-length of the characters ahead of time.

One embodiment is directed to an electronic device which provides electronic access to a dataset representing meaningful information (e.g., a 16 KB block of data). The electronic device generates a first subset permutation based on a first subset of the dataset, and generates a second subset permutation based on a second subset of the dataset. Each subset of the dataset includes a series of data elements having a particular fixed bit-length. The first subset permutation includes a rearrangement of the series of data elements of the first subset, and the second subset permutation similarly includes a rearrangement of the series of data elements of the second subset (e.g., individual application of the Burrows Wheeler Transform to separate 4 KB sections of the 16 KB block of data). The electronic device further forms an electronic aggregation based on the first subset permutation and the second subset permutation (e.g., a shuffle-concatenation operation), and generates an aggregation permutation based on the electronic aggregation (e.g., a recursive application of the Burrows Wheeler Transform). The aggregation permutation includes a rearrangement of portions of the electronic aggregation which is well-suited for follow-on processing such as data compression. Furthermore, the meaningful information is fully recoverable from the aggregation permutation thus enabling lossless operation.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

System Overview

An improved technique involves recursive application of a transform which uses lexicographic ordering such as the Burrows Wheeler Transform (BWT). In contrast to a conventional single application of the BWT to data, such recursive application of a transform advances the rate of character migration (or migration of other types of data elements) and thus improves compression effectiveness. Between applications of the transform, a permutation/shuffle-concatenation operation is performed which progresses the data for better compression results. Furthermore, application of a set of different bit-length reversible transforms and a comparison of entropy results conveniently enables identification of an optimal bit-length for the reversible transform without needing to access to the entire data file or knowing the true bit-length of the characters ahead of time.

Figure 1:
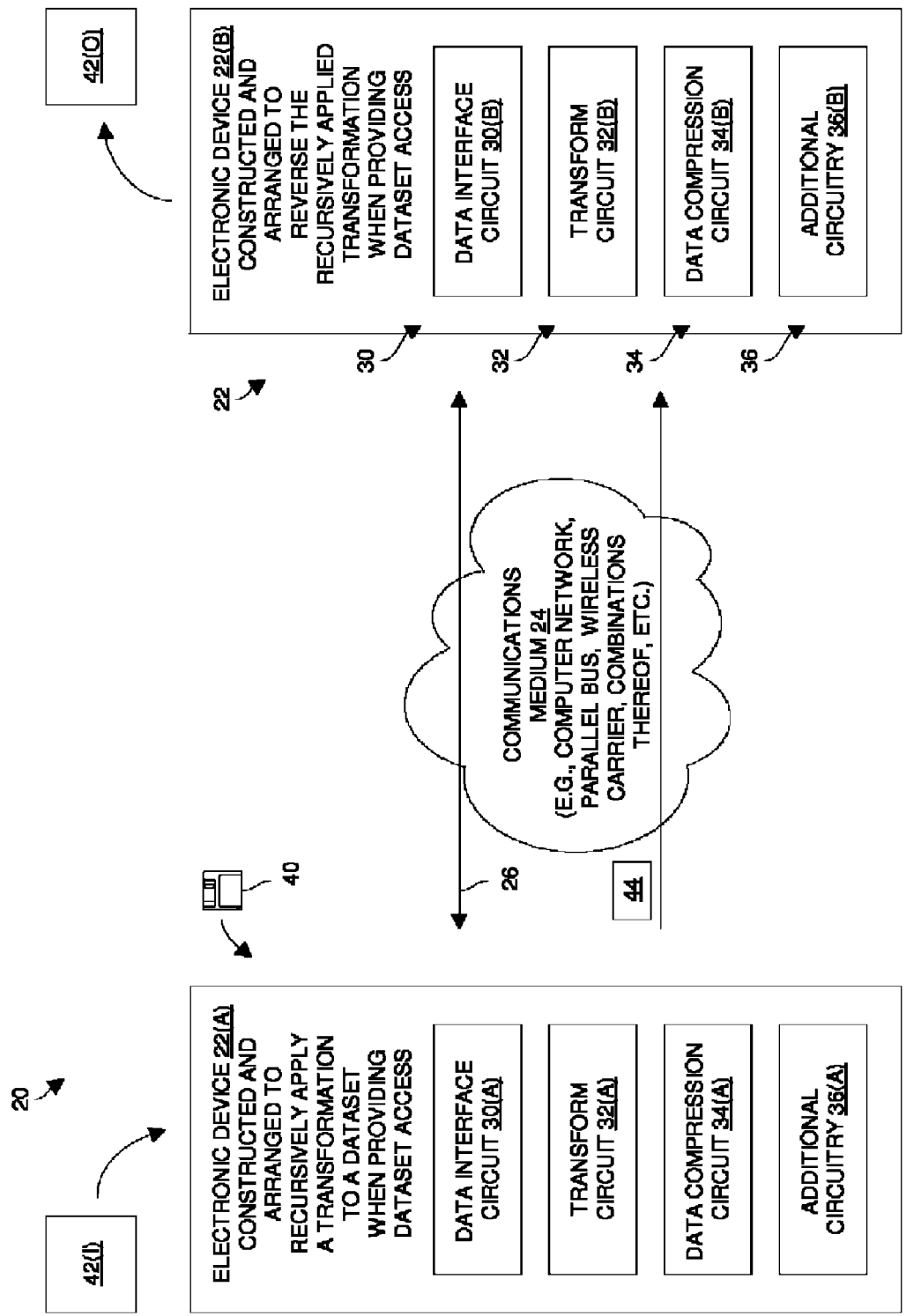
FIG. 1 is a block diagram of an electronic system which utilizes recursive application of a transform involving lexicographic ordering.

FIG. 1 is a block diagram of an electronic system 20 which recursively applies a reversible transform (e.g., the BWT) on data. The electronic system 20 includes electronic devices 22(A), 22(B) (collectively, electronic devices 22) and a communications medium 24 which conveys electronic signals 26 between the electronic devices 22.

Each electronic device 22 is a specialized machine which is constructed and arranged to utilize recursive application of the reversible transform. Along these lines, each electronic device 22 includes a data interface circuit 30 for connecting to the communications medium 24, a transform circuit 32 for applying and reversing the transform, a data compression circuit 34 for compressing and uncompressing data, and additional circuitry 36 (e.g., non-volatile storage, user I/O circuitry, etc.). In particular, the electronic device 22(A) includes a data interface circuit 30(A), a transform circuit 32(A), a data compression circuit 34(A), and additional circuitry 36(A). Similarly, the electronic device 22(B) includes a data interface circuit 30(B), a transform circuit 32(B), a data compression circuit 34(B), and additional circuitry 36(B).

In some arrangements, one or more of the various circuit components is implemented via specialized hardware. For example, such circuit components may take the form of Application Specific Integrated Circuits (ASICs), Field Programmable Gate Arrays (FPGAs) loaded with predefined states, custom logic, combinations thereof, and the like. In these arrangements, it is possible to connect at least some of the specialized hardware with programmed computerized circuitry (e.g., a set of processors running software) such as for preprocessing, post-processing, and/or control purposes.

In some arrangements, one or more of the various circuit components is implemented using a programmed set of processors which carries out specialized instructions obtained from a computer program product 40. In these arrangements, the instructions are stored digitally in a non-volatile manner on a tangible computer readable medium of the computer program product 40 such as on a set of CD-ROMS, a set of diskettes, magnetic tape, flash memory, combinations thereof, and the like. In these arrangements, it is possible to connect the programmed set of processors with specialized hardware (e.g., ASICs, FPGAs, custom logic, etc.) to optimize performance for certain operations (e.g., particular data transformation operations, particular data compression operations, etc.).

With the additional circuitry 36, it should be understood that the electronic devices 22 are able to perform operations beyond simply utilizing recursive application of the reversible transform. For example, the electronic devices 22 can operate as a storage controller for performing data storage operations on an array of storage drives, a network appliance for supplying network storage and/or caching, an intermediate network node for performing routing/switching operations, a compute engine for executing computerized commands, combinations thereof, etc.

During operation of the electronic system 20 and with respect to recursive application of the reversible transform, the data interface circuit 30(A) of the electronic device 22(A) receives a dataset 42(I) representing meaningful information, and provides the dataset 42(I) to the transform circuit 32(A). An example of such a dataset 42(I) is the payload of a network transmission such as the body of a TCP/IP packet received from an edge or intermediate device or circuit. Another example of such a dataset 42(I) is a block of data (e.g., 16 KB of block storage, 4 KB of block storage, etc.) which is to be written to or read from a magnetic disk drive by a control circuit. In such situations, only a portion of the entire contents of a larger construct (e.g., less than all of a data file) may be visible to the electronic device 22(A). Accordingly, the true bit-length of the data within the dataset 42(I) may not be known at the time of receipt of the dataset 42(I).

Next, the transform circuit 32(A) performs a permutation/shuffle-concatenation operation and recursively applies the reversible transform to the dataset 42(I) to form a dataset permutation, and the data compression circuit 34(A) compresses the dataset permutation to form a compressed digital representation 44. The meaningful information is nevertheless fully preserved because the compressed digital representation 44 can be uncompressed and the transform can be reversed in a lossless manner. The data interface circuit 30(A) then sends the compressed digital representation 44 and some supplemental information (see the electronic signals 26 in FIG. 1) to the electronic device 22(B) through the communications medium 24.

The electronic device 22(B) receives the compressed digital representation 44, and performs data reconstruction. In particular, the data interface circuit 30(B) of the electronic device 22(B) provides the compressed digital representation 44 to the data compression circuit 34(B) which uncompresses the compressed digital representation 44 to reform the dataset permutation. The transform circuit 32(B) then unshuffles and reverses the recursively applied transformation (i.e., performs a recursive inverse transform processes) to output a reconstructed dataset 42(O) which is then made available via the data interface circuit 30(B). The entire process is lossless in that all of the meaningful information from the dataset 42(I) is available in the dataset 42(O) (collectively, datasets 42) regardless of the type of data (e.g., characters, symbols, pixels, etc.).

It should be understood that the electronic device 22(A) was described above as transforming and compressing the dataset 42, and that the electronic device 22(B) was described above as fully reconstructing the dataset 42 via decompressing and reversing the transform. It should be further understood that the electronic system 20 is capable of working in the opposite direction as well. That is, electronic device 22(B) is similarly capable of transforming and compressing a dataset 42, and the electronic device 22(A) is capable of fully reconstructing that dataset 42 via decompressing and reversing the transform in a lossless manner for full bi-directional operation.

At this point, it should be understood that the communications medium 24 which conveys the compressed digital representation 44 between the electronic devices 22 is capable of including one or more types of data transport architectures (e.g., a computer network, a parallel bus, a serial bus, differential pair, combinations thereof, etc.) and is thus illustrated as a cloud in FIG. 1. Along these lines, the communications medium 24 is capable of including one or more data communications devices and/or intermediate circuits (e.g., electrical signal hardware, optical signal hardware, wireless hardware, combinations thereof, etc.). Moreover, the communications medium 24 is capable of having a variety of topologies (e.g., backbone, hub and spoke, ring, distributed or irregular topology, combinations thereof, and so on).

Furthermore, it should be understood that less bandwidth is consumed when sending the compressed digital representation 44 of the meaningful information vis-à-vis sending the larger dataset 42(I) received by the electronic device 22(A). Nevertheless, the meaningful information is fully available within the dataset 42(O) which is outputted by the electronic device 22(B).

Moreover, as will be explained in further detail shortly, recursive application of the transform to the dataset 42(I) progresses character migration beyond what is typically achieve via a single conventional application of the BWT. Accordingly, the permuted data resulting from recursive application of the transform provides better compression results than what would otherwise be provided by permuted data from a single application of the transform.

Transform Details

As mentioned earlier, recursive application of the transform is capable of improving character migration within a dataset 42 (FIG. 1). That is, suppose that there is minor improvement in the data of the dataset 42 after an initial application of the transform but that the data remains somewhat uniform (i.e., high entropy). In this situation, an operation which aggregates similar portions of transformed data and a subsequent application of the transform can further advance migration of the characters thus yielding better data compression results.

Figure 2:
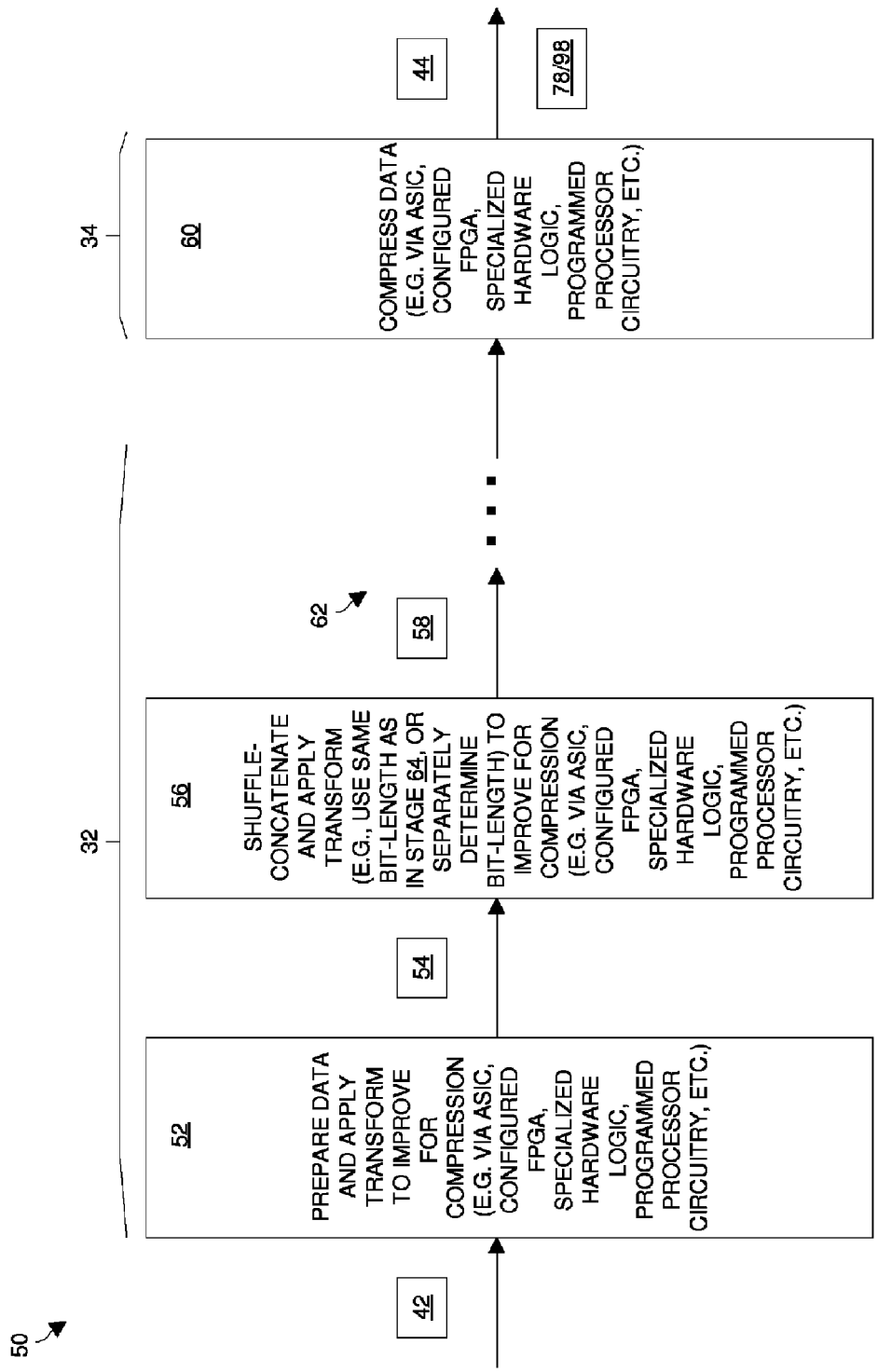
FIG. 2 is a block diagram illustrating a process for compressing data by an electronic device of the electronic system of FIG. 1.

FIG. 2 shows a series of data processing stages 50 which is formed by particular components of each electronic device 22 for data compression (also see FIG. 1). In particular, the series of stages 50 includes a first stage 52 for initially applying the reversible transform to a dataset 42 to form a transformed dataset 54, and a second stage 56 for performing a specialized shuffle-concatenation operation and applying the reversible transform to form a recursively transformed dataset 58 based on the transformed dataset 54. The first and second stages 52, 56 form at least a part of the transform circuit 32 of the electronic device 22 (FIG. 1).

The series of data processing stages 50 further includes a compression stage 60 which compresses the recursively transformed dataset 58 to form a compressed digital representation 44 of the meaningful information. The compression stage 60 forms at least part of the compression circuit 34 of the electronic device 22.

The stages 52, 56, 60 are arranged to process data in a pipelined manner. Optionally, one or more other stages 62 can be disposed between the second stage 56 and the compression stage 60 to further process data (e.g., to perform further shuffle-concatenate and/or transform operations to further improve the data prior to compression).

Figure 3:
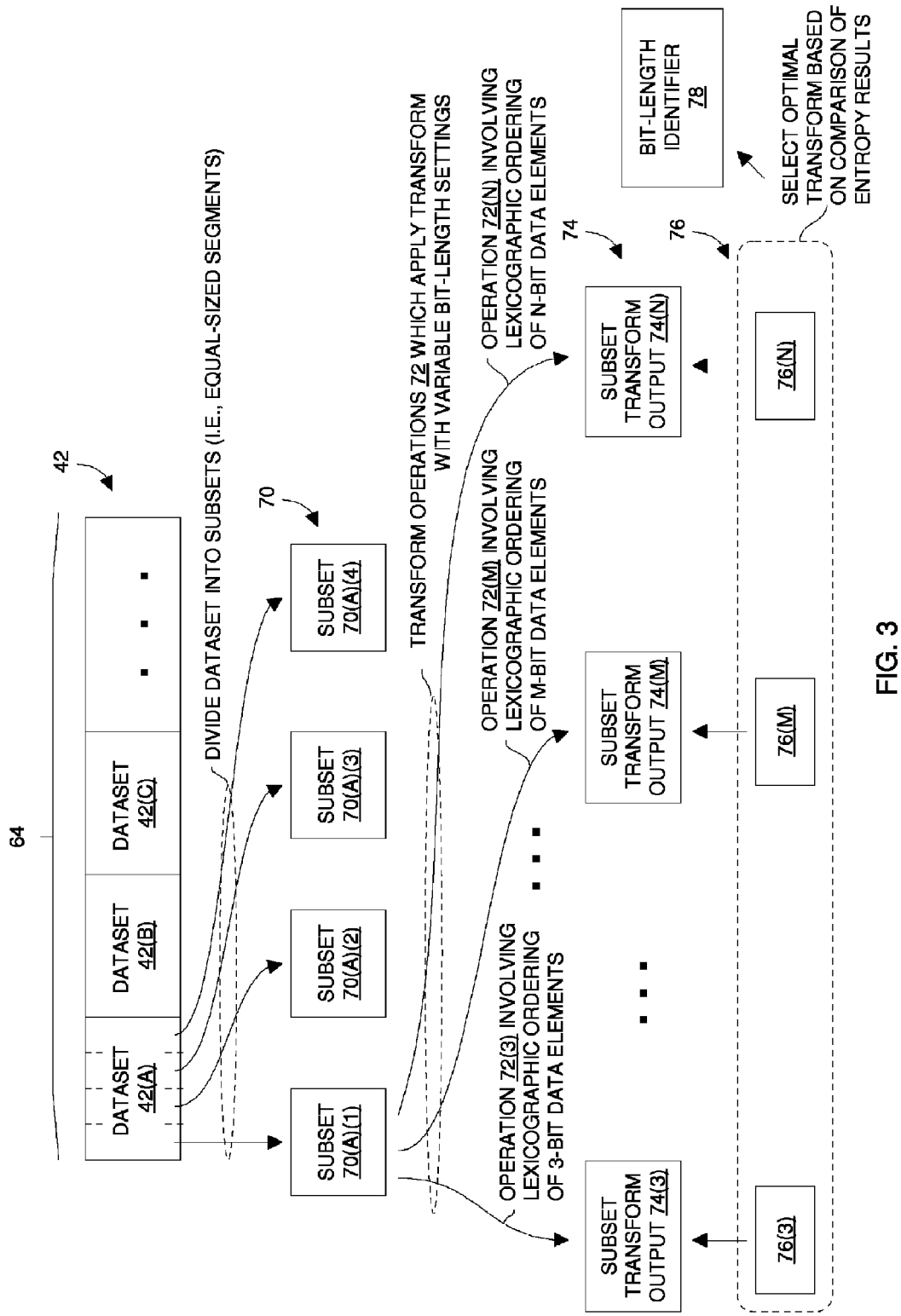
FIG. 3 is a block diagram of particular details of a portion of the process of FIG. 2.
Figure 4:
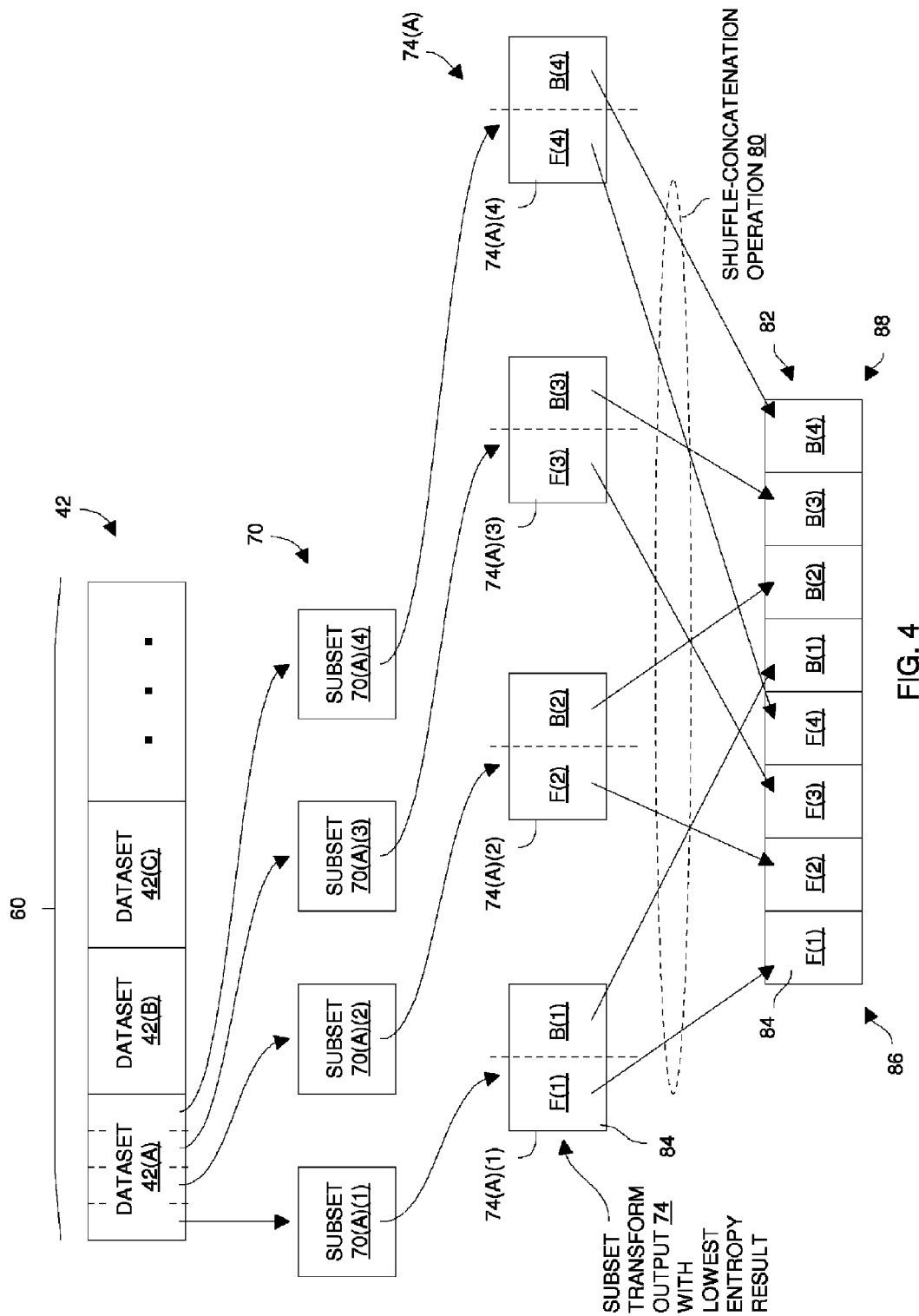
FIG. 4 is a block diagram of particular details of another portion of the process of FIG. 2.
Figure 5:
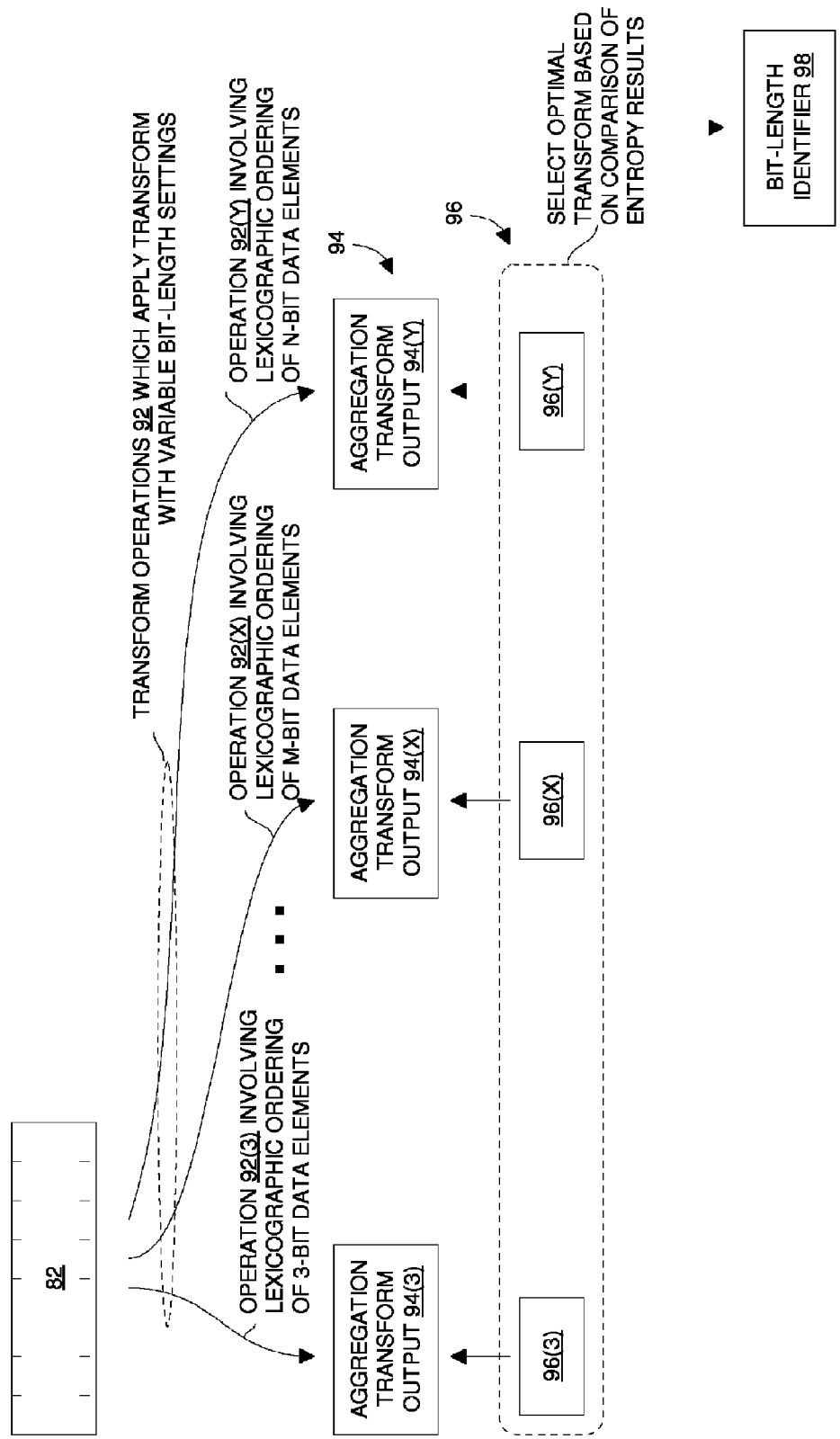
FIG. 5 is a block diagram of particular details of yet another portion of the process of FIG. 2.

FIGS. 3 through 5 show particular details of how a dataset 44 is processed during recursive application of the transform. As shown in FIG. 3, the dataset 44 may belong to a larger construct such as a data file 64 (e.g., a video file, a bitmap, a text document, a database, etc.). Along these lines, each dataset 42(A), 42(B), 42(C), . . . of the data file 64 may arrive at the electronic device 22 (or at the series of stages 50) separately, and therefore the complete data file 64 may not be visible at the time of receipt of the dataset 42. For example, in the context of a network device, the contents of the data file 64 may be spread out within the payloads of multiple separate network packets or transmissions. As another example, in the context of a storage controller, a block of data may be written from a cache to a disk drive or from the disk drive into the cache. Accordingly, the true bit-length of the characters within the dataset 42 may not be known.

Suppose that the datasets 42 arrive at the series of stages 50 one at a time. Upon arrival of the dataset 42(A), the first stage 52 divides the dataset 42(A) into a series of four subsets 70(A)(1), 70(A)(2), 70(A)(3), 70(A)(4) (collectively, subsets 70). The subsets 70 are equal-sized, sequential data segments.

After the dataset 42(A) is partitioned into the subsets 70, the first stage 52 performs multiple transform operations 72 which apply the reversible transform to the first subset 70(A)(1) using a variety of different bit-length settings to generate multiple transform outputs 74 for determination of which bit-length setting to use for processing the other subsets 70. For example, in a transform operation 72(3), the first stage 52 parses the first subset 70(A)(1) into a series of 3-bit data elements (i.e., the data is considered to be a sequence of characters, each character being 3-bits in length) and then transforms that series into a subset transform output 74(3). Similarly, in another transform operation 72(M), the first stage 52 parses the first subset 70(A)(1) into a series of M-bit data elements (e.g., 4-bits, 8-bits, 9-bits, 10-bits, 16-bits, etc.) and then transforms that series into another subset transform output 74(M). Likewise, in another transform operation 72(N), the first stage 52 parses the first subset 70(A)(1) into a series of N-bit data elements (N being another integer which is different than M) and then transforms that series into another subset transform output 74(N), and so on.

It should be understood that the transform operations 72 can be performed for all bit-lengths (e.g., 3, 4, 5, 6, etc.) to enable identification of the optimal bit-length transform. Alternatively, the transform operations 72 can be performed for just certain bit-lengths (e.g., the most common or likely used, etc.).

Along these lines, the BWT, which enables the subset transform output 74 to be derived from lexicographically sorted rotations of the data elements within the subset 70(A)(1), is well-suited as the reversible transform. However, in contrast to a conventional application of the BWT which is typically on characters (or symbols) only (i.e., the true bit-length is all ready known), such a comprehensive application of the BWT using different bit-lengths enables the circuitry to identify an optimal transform without knowing the true bit-length of the data ahead of time.

In some arrangements, the transform operations 72 are performed in parallel by a specialized circuit (e.g., an ASIC) to minimize overall processing time and alleviate the need to consume computer processing cycles. In other arrangements, such as those which are more tolerant to longer response times, the transform operations 72 are performed serially to utilize the same processing circuitry to alleviate the need for custom circuitry and to enable easier upgrades.

For each subset transform output 74, the first stage 52 generates an entropy result 76 using standard entropy computational techniques. The first stage 52 then compares the entropy results 76, and outputs a bit-length identifier 78 which identifies the bit-length of the particular transform operation 72 responsible for generating the subset transform output 74 with the lowest entropy result 76 as the transform operation 72 to be applied to the other subsets 70.

The particular subset transform output 74 with the lowest entropy result 76 is labeled 74(A)(1) in FIG. 4. At this point, only a portion of the dataset 42(A) has been permuted, and the remaining subsets 70(A)(2), 70(A)(3), 70(A)(4) are available for initial permuting.

It is assumed that the data within the first subset 70(A)(1) is a good representation of the data within the other subsets 70. Accordingly, the transform operation 72 responsible for generating the subset transform output 74 which is the least uniform (i.e., having the lowest entropy) from the first subset 70(A)(1) will likely have the same good results on the other subsets 70, and is thus well suited for providing good compression results in a subsequent stage.

As shown in FIG. 4, once the transform operation 72 responsible for generating the subset transform output 74 with the lowest entropy result 76 has been identified (see the bit-length identifier 78 in FIG. 3), the first stage 52 automatically applies the same transform operation 72 (i.e., the transform with the same particular bit-length) to the remaining subsets 70(A)(2), 70(A)(3), 70(A)(4). For example, if application of the transform on byte-length data elements provided the lowest entropy result 76 for the first subset 70(A)(1), the first stage 52 applies the transform on byte-length data elements for subsets 70(A)(2), 70(A)(3), 70(A)(4).

This initial application of the transform to the subsets 70 results in generation of respective subset transform outputs 74(A) (FIG. 4). In particular, the first stage 52 generates the subset transform output 74(A)(1) from the subset 70(A)(1). Similarly, the first stage 52 generates subset transform output 74(A)(2) from the subset 70(A)(2), subset transform outputs 74(A)(3) from the subset 70(A)(3), and subset transform output 74(A)(4) from the subset 70(A)(4).

At this point, the first stage 52 has permuted all of the data within the dataset 42(A). The first stage 52 then provides the subset transform outputs 74 to the second stage 56 for further preparation and processing. The subset transform outputs 74 are illustrated as the transformed dataset 54 in FIG. 2.

As shown in FIG. 4 and upon receipt of the subset transform outputs 74 from the first stage 52, the second stage 56 performs a shuffle-concatenation operation 80 to form an electronic aggregation 82 based on the subset transform outputs 74. In particular, the second stage 56 groups together like-positioned pieces of the different subset transform outputs 74. That is, the second stage 56 partitions each subset transform output 74 into multiple sections 84 (e.g., see the dashed dividing lines in FIG. 4) and concatenates the sections 84 in an interleaved manner to form the electronic aggregation 82.

In the above-described shuffle-concatenation operation 80, the second stage 56 divides each subset transform output 74 specifically into two sections 84, i.e., a front half F and a back half B, by way of example only. In particular, the subset transform output 74(A)(1) is partitioned into sections F(1), B(1), the subset transform output 74(A)(2) is partitioned into sections F(2), B(2), the subset transform output 74(A)(3) is partitioned into sections F(3), B(3), and the subset transform output 74(A)(4) is partitioned into sections F(4), B(4). Next, as part of the shuffle-concatenation operation 80, the second stage 56 brings like-order sections 84 of different subset transform outputs 74 together in an interleaved manner to create the electronic aggregation 82. It will be explained shortly that the shuffle-concatenation operation 80 can divide each subset transform output 74 into more than two sections 84 in alternative arrangements. In particular, although illustrated using a "perfect shuffle", an arbitrary permutation of the dataset is possible at the point/stage.

As a result of the shuffle-concatenation operation 80, like-order pieces of different outputs 74 are concatenated together. That is, the electronic aggregation 82 includes the front sections F ordered at the front 86 of the electronic aggregation 82, followed by the next sections in order, and so on. The next ordered sections B follow the ordered front sections F, and form the back 88 of the electronic aggregation 82.

After the electronic aggregation 82 is formed, the second stage 56 applies the reversible transform to the electronic aggregation 82 to further permute the data. Such operation is essentially a recursive application of the transform to further advance data element migration. The resulting aggregation transform output is illustrated as the recursively transformed dataset 58 outputted from the second stage 56 in FIG. 2, and one of the outputs labeled 94 in FIG. 5.

In some arrangements, the second stage 56 performs a transform operation 92 which uses the same bit-length as that identified by the first stage 52 for the subsets 70. Recall that the particular bit-length for the transform operation 72 is identified by the bit-length identifier 78 (see FIG. 3). For example, if application of the transform on byte-length data elements was identified as providing the lowest entropy result 76 for the first subset 70(A)(1), the second stage 56 applies the transform on byte-length data elements on the electronic aggregation 82. This transform operation 92 is essentially a recursive application of the reversible transform (e.g., the BWT) since the input to the transform operation 92 is data that has already been permuted by the first stage 52.

In other arrangements and as illustrated in FIG. 5, the second stage 56 applies the transform on the electronic aggregation 82 by performing multiple transform operations 92 using a variety of different bit-length settings in a manner similar to that described above by the first stage 52. These transform operations 92 differ from the transform operations 72 in that the transform operations 72 take, as input, the non-permuted data of the subsets 70 while the transform operations 92 take, as input, the permuted data of the electronic aggregation 82. Again, in these arrangements, these transform operations 92 involve recursive application of the reversible transform since the input to the transform operations 92 is data that has already been permuted by the first stage 52.

As shown in FIG. 5, the result of a transform operation 92 is a transform output 94. In the context of multiple transform operations 92 using a variety of different bit-length settings, there are of course multiple transform outputs 94. For example, in a transform operation 92(3), the second stage 56 parses the electronic aggregation 82 into a series of 3-bit data elements and then transforms that series into a subset transform output 94(3). Similarly, in another transform operation 92(X), the second stage 56 parses the electronic aggregation 82 into a series of X-bit data elements (e.g., 4-bits, 8-bits, 9-bits, 10-bits, 16-bits, etc.) and then transforms that series of X-bit data elements into another subset transform output 94(X). Likewise, in another transform operation 92(Y), the second stage 56 parses the electronic aggregation 82 into a series of Y-bit data elements (Y being another integer which is different than X) and then transforms that series into another subset transform output 94(Y), and so on.

Additionally, in the context of multiple transform operations 92, the second stage 56 generates corresponding entropy results 96 for the respective aggregation transform outputs 94 and identifies the aggregation transform output 94 having the lowest entropy as the recursively transformed dataset 58 for processing in the next stage (also see FIG. 2). The second stage 56 outputs a bit-length identifier 98 identifying the bit-length of the particular transform operation 92 was used to obtain the recursively transformed dataset 58.

Again, it should be understood that the transform operations 92 can be performed concurrently (or alternatively serially) for all bit-lengths (e.g., 3, 4, 5, 6, etc.) to enable identification of the optimal transform output 94 for compression. Alternatively, the transform operations 92 can be performed for certain predefined bit-lengths (e.g., the most common or likely used bit-lengths, etc.).

After the second stage 56 outputs the recursively transformed dataset 58, the compression stage 60 (FIG. 2) compresses the recursively transformed dataset 58 to form the compressed digital representation 44. In some arrangements, the compression stage 60 includes a compression engine having a series of compression circuits having a move-to-front circuit, a run-length encoding circuit, and an entropy encoding circuit. In these arrangements, the recursively transformed dataset 58 is input into the series of compression circuits to generate the compressed digital representation 44.

The data interface circuit 30 of the electronic device 22 (e.g., the electronic device 22(A)) then sends the compressed digital representation 44 along with the bit-length identifiers 78, 98 to another electronic device 22 (e.g., the electronic device 22(B)) through the communications medium 24. The bit-length identifiers 78, 98 identify the bit-lengths used for the transforms thus enabling the receiving electronic device 22 to properly reverse the transform during data reconstruction. Due to shuffle-concatenation and recursive application of the reversible transform, the process 50 (FIG. 2) has higher data compression rate to that involving a conventional single application of the transform. Accordingly, the compressed digital representation 44 outputted by the compression stage 60 consumes less bandwidth and related resources as it travels between electronic devices 22 through the communications medium 24 (FIG. 1).

It should be understood that other datasets 42(B), 42(C), ... of the data file 64 (FIG. 3) are capable of being processed in the same way as that of the dataset 42(A). In particular, if it is known that the other datasets 42(B), 42(C), ... belong to the same data file 64 as the dataset 42(A), the transform using the same bit-length (e.g., as identified by the identifiers 78, 98) can be applied by the stages 52, 56 automatically. However, if this is not known that the other datasets 42(B), 42(C), ... belong to the same data file 64, the other datasets 42(B), 42(C), ... can be processed by the stages 52, 56 in a similar manner to that of the dataset 42(A), i.e., transformations using different bit-lengths are applied and selection of which bit-length to use is based on a comparison of entropy results 76 in a manner similar to that described earlier for the dataset 42(A).

Shuffle-Concatenation for Recursive Application of Transform

It should be understood that the characteristics of each transform output 74 from the first stage 54 (FIG. 2) are expected to be similar. That is, the characteristics of like-pieces of each output 74 are expected to be roughly the same. Accordingly, when the second stage 58 performs the above-described shuffle-concatenation operation 80, the second stage 58 accelerates migration of the characters even further by grouping the like-pieces more closely together.

Figure 6:
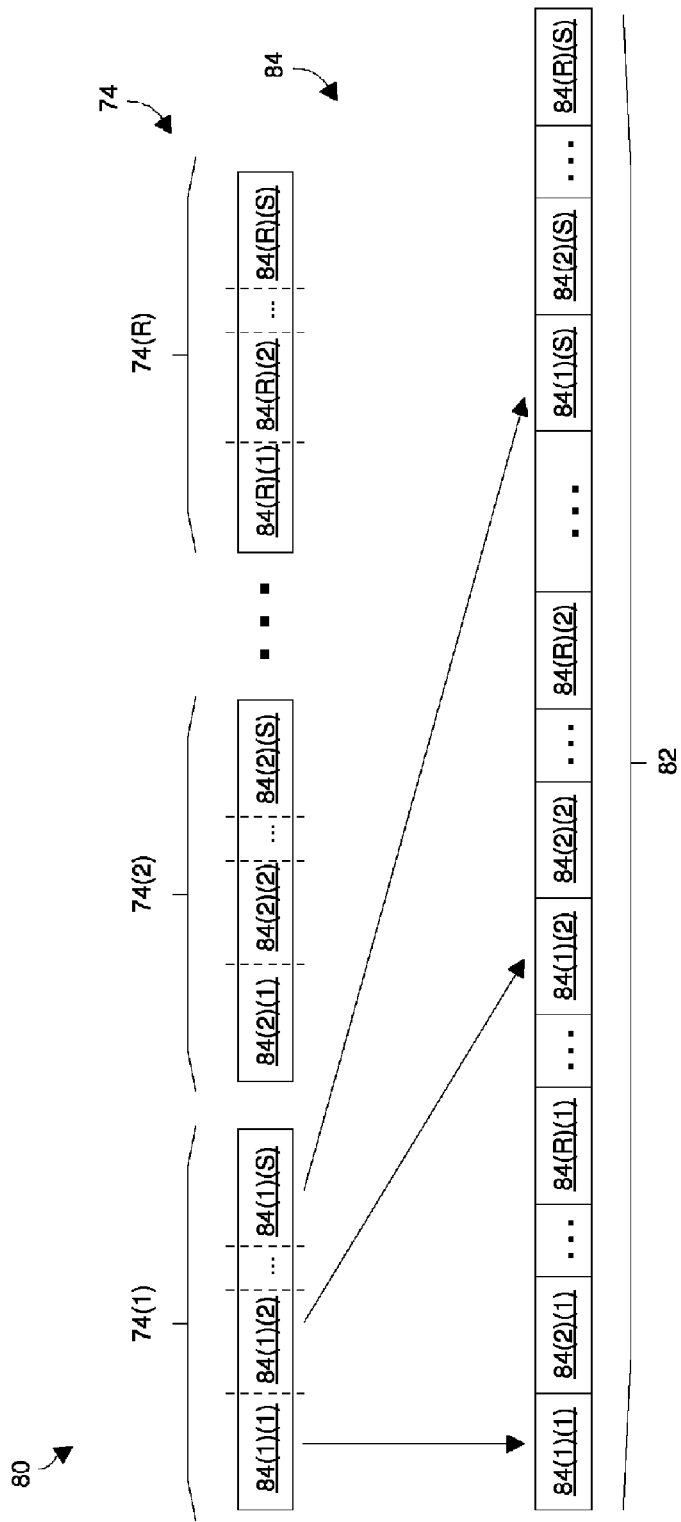
FIG. 6 is a block diagram of a general shuffling-concatenation operation performed during the process of FIG. 2.

FIG. 6 shows a general diagram that is appropriate when the shuffle-concatenation operation 80 involves dividing the transform outputs 74 into more than simply two sections (i.e., more than a front section F and a back section B as shown in FIG. 3). In the general diagram of FIG. 6, the output from the first stage 54 includes multiple transform outputs 74(1), 74(2), ... 74(R).

Additionally, the shuffle-concatenation operation 80 involves dividing each transform output 74 into multiple sections 84. For example, the shuffle-concatenation operation 80 divides the transform output 74(1) into sections 84(1)(1), 84(1)(2), ..., 84(1)(S), and the transform output 74(2) into sections 84(2)(1), 84(2)(2), ..., 84(2)(S). Similarly, the shuffle-concatenation operation 80 divides the output 74(R) into sections 84(R)(1), 84(R)(2), ..., 84(R)(S), and so on.

Next, the shuffle-concatenation operation 80 recombines the sections 84 to form the electronic aggregation 82. In particular, the shuffle-concatenation operation 80 concatenates like-order sections 84 of the transform outputs 74 to form the electronic aggregation 82. That is, the shuffle-concatenation operation 80 unites the first sections 84(1)(1), 84(2)(1), ..., 84(R)(1) of the transform outputs 74 together, followed by the second sections 84(1)(2), 84(2)(2), ..., 84(R)(2), and so on.

Reconstruction

Figure 7:
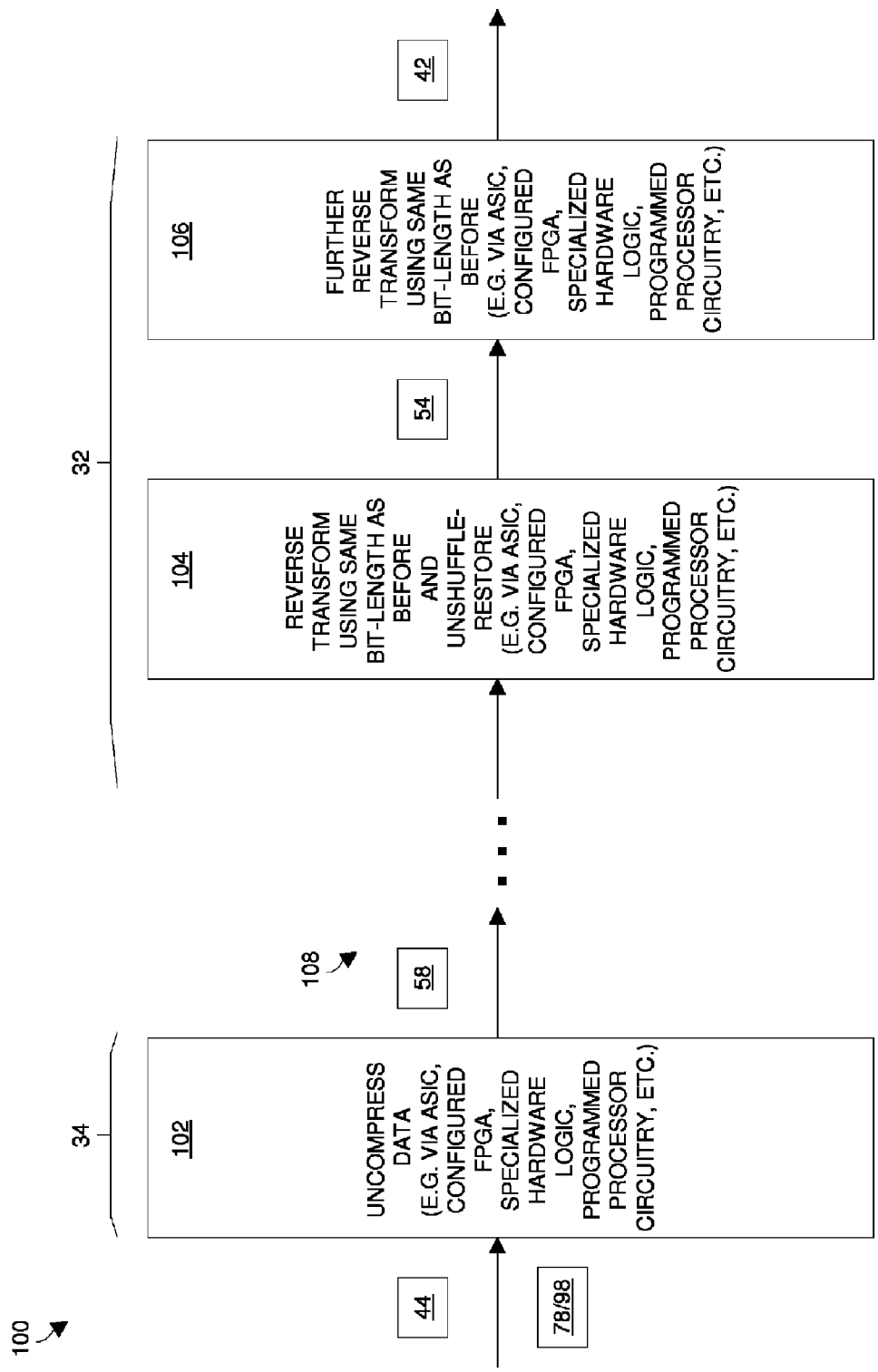
FIG. 7 is a block diagram illustrating a process for decompressing data by an electronic device of the electronic system of FIG. 1.

FIG. 7 shows a series of data processing stages, 100 which is formed by particular components of an electronic device 22 (also see FIG. 1), for reconstructing a dataset 42 in a lossless manner from a compressed digital representation 44 and the identifiers 78, 98. The series of stages 100 essentially reverses the process carried out by the series of stages 50 (also see FIGS. 2 through 5).

The series of stages 100 includes a decompression stage 102, and reverse transform stages 104, 106 which are arranged to process data in a pipelined manner. Optionally, additional stages 108 can be disposed between the decompression stage 102 and the transform stage 104 to reverse any additional processing operations performed by the series of stages 50 (also see reference numeral 62 in FIG. 2). As mentioned earlier in connection with the series of stages 50, the various components which are involved with such processing can be implemented using specialized hardware (e.g., ASICs, FPGAs, custom logic, etc.), a programmed set of processors (e.g., microprocessors running software/firmware), combinations thereof, etc.

As shown in FIG. 7, the stage 102 uncompresses the compressed digital representation 44 to form a recursively transformed dataset 58. In some arrangements, the stage 102 includes a decompression engine having a series of decompression circuits to reverse move-to-front, run-length encoding and entropy encoding operations performed by the compression stage 60 (FIG. 2). The recursively transformed dataset 58, which is output from the stage 102, corresponds to an aggregation transform output 74 previously generated by recursive application of the transform (also see the aggregation transform output 94 in FIG. 5).

The stage 104 reverses the transform to reconstruct the electronic aggregation 82 based on the recursively transformed dataset 58 (also see FIG. 4). Recall that in some arrangements, the second stage 56 simply performed the transform operation 72 using the bit-length identifier 78 from the first stage 52 to recursively transform the electronic aggregation 82 into the recursively transformed dataset 58. In these arrangements, the stage 104 refers to the same bit-length identifier 78 from the first stage 52 to properly reverse the transform and generate the electronic aggregation 82.

However, in other arrangements, the second stage 56 performed separate multiple transform operations 92 and selected the output having the lowest entropy. In these arrangements, the second stage 56 identified the bit-length of the transform operation 92 providing the output with the lowest entropy using the bit-length identifier 98 (also see FIG. 5). Accordingly, in these arrangements, the stage 104 refers to the same bit-length identifier 98 from the second stage 56 to properly reverse the transform and generate the electronic aggregation 82.

Once the stage 104 has generated the electronic aggregation 82 from the recursively transformed dataset 58, the stage 104 performs an unshuffle-restore operation to reverse the effects of the earlier-performed shuffle-concatenation operation (also see FIGS. 4 and 6). In particular, the stage 104 divides the electronic aggregation 82 back into sections 84, and redistributes the sections 84 into respective subset transform outputs 74 (also see FIG. 4). Since the shuffle-concatenation operation performed by the second stage 56 was completely predefined, the stage 104 is capable of carrying out restoration of the subset transform outputs 74 from the electronic aggregation 82 with absolute precision. After completion of the unshuffle-restore operation, the stage 104 provides the subset transform outputs 74 to the stage 106.

Next, the stage 106 reverses the transform on the subset transform outputs 74 to obtain the dataset 42. In particular, the stage 106 refers to the same bit-length identifier 78 from the first stage 52 (FIG. 2) to determine the bit-length of the transform operation 72 and then performs an appropriate reverse of the transform to generate the subsets 70 (also see FIG. 4). Once the subsets 70 have been generated, the stage 106 recombines the subsets 70 to form the dataset 42.

It should be understood that the processes performed by the series of stages 100 fully reconstruct the dataset 42 that was initially input to the series of stages 50. Accordingly, the electronic system 20 provides lossless processing and transfer of data in that all of the meaningful information is maintained.

CONCLUSION

Figure 8:
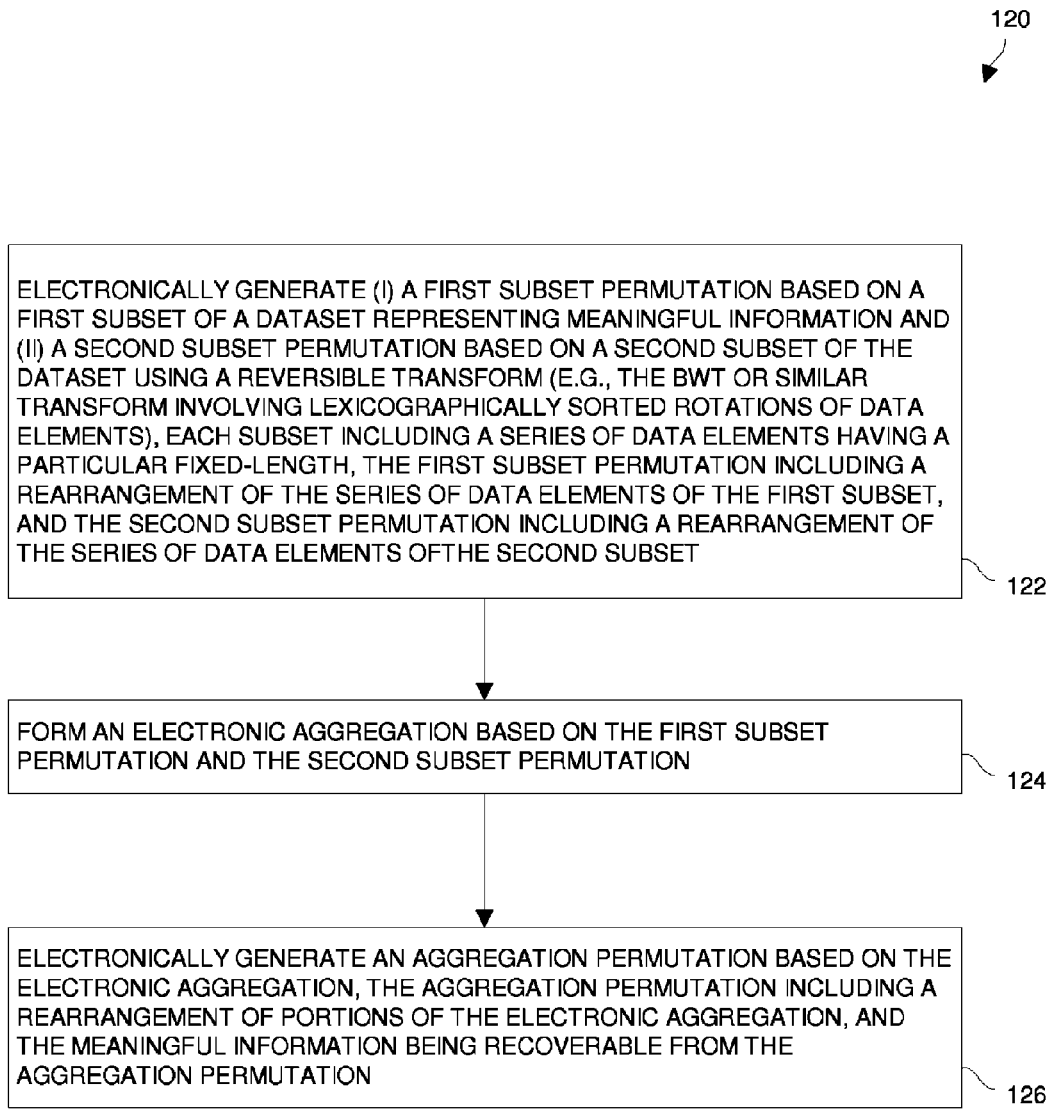
FIG. 8 is a flowchart of a procedure which is performed by the electronic system of FIG. 1.

FIG. 8 is a flowchart of a procedure 120 which is performed by an electronic device 22 of the electronic system 20 when recursively applying a transform while providing electronic access to a dataset 42. As mentioned previously, the BWT (or a similar transform involving lexicographic sorting of rotations of data elements) is suitable for use in the procedure 120.

In step 122, the electronic device 22 electronically generates a first subset permutation 74 based on a first subset 70 of the dataset 42, and a second subset permutation 74 based on a second subset 70 of the dataset 42(I) (also see the transform circuit 32 in FIG. 1 and the series of stages 50 in FIG. 2). The dataset 42 represents meaningful information. Each subset 70 of the dataset 42 includes a series of data elements having a particular fixed bit-length, the first subset permutation 74 including a rearrangement of the series of data elements of the first subset 70, and the second subset permutation 74 including a rearrangement of the series of data elements of the second subset 70 (also see FIG. 4).

In step 124, the electronic device 22 forms an electronic aggregation 82 based on the first and second subset permutations 74. Such formation involves performance of a permutation/shuffle-concatenation operation 80 by aggregation circuitry within a stage 56 of the series of stages 50 (FIGS. 2, 4 and 6).

In step 126, the electronic device 22 electronically generates an aggregation permutation 94 based on the electronic aggregation 82. The aggregation permutation 94 includes a rearrangement of portions of the electronic aggregation 82, and the meaningful information is fully recoverable from the aggregation permutation 82.

Such transformation is particularly well-suited as a front-end to compression activity. For example, such transformation suitable for use with move-to-front encoding, run-length encoding, and/or entropy encoding (e.g., Huffman encoding).

As mentioned above, an improved technique involves recursive application of a reversible transform which uses lexicographic ordering. Such recursive application of the reversible transform (i.e., a first application of the reversible transform to an input to generate a partial transform result, and subsequent application of the reversible transform to the partial transform result) improves the rate of character migration and thus compression effectiveness. Between applications of the transform, a permutation/shuffle-concatenation operation 80 is performed which advances the data for improved compression results. Furthermore, application of a set of different bit-length reversible transforms and a comparison of entropy results can enable identification of an optimal reversible transform thus alleviating the need to access to the entire data file or know the true bit-length of the characters ahead of time.

While various embodiments of the invention have been particularly shown and described, it will be understood by those skilled in the art that various changes in form and details may be made therein without departing from the spirit and scope of the invention as defined by the appended claims.

For example, the BWT was mentioned above as being an appropriate reversible transform utilized by the electronic system 20. Other reversible transforms which use involve lexicographic ordering are suitable for use as well such as a transform disclosed in a publication entitled "A Bijective String Sorting Transform" by J. Gil and D. A. Scott, the teachings of which are hereby incorporated by reference in their entirety.

Additionally, it should be understood that the series of stages 50 (FIG. 2) could apply different or additional transforms to further improved the compression rate. In such situations, the series of stages 100 (FIG. 7) would simply reverse the transforms applied by the series of stages 50.

Furthermore, it should be understood that the above-described techniques are independent of the type of data being processed. That is, the transform involves lexicographic ordering in the sense that data is parsed into a series of equal bit-length data elements. However, the above-described techniques are independent of the nature of the underlying data (e.g., pixels, characters/symbols, code, etc.). In all cases, the compression rate remains relatively high.

Moreover, it should be understood that the above-described techniques were presented in the context of handling data on the fly where only a limited amount of the data is visible at one time to the compression engine (i.e., online compression). In other arrangements, the data is at rest such as in a data storage system or a storage appliance which compresses the data prior to storage and uncompresses the data upon retrieving the data from storage. In these arrangements, it is unnecessary to read the entire file prior to processing.

What is claimed is:

1. An electronic device for providing electronic access to a dataset, the electronic device comprising:
a data interface circuit;
a transform circuit coupled to the data interface circuit, the transform circuit being constructed and arranged to:
receive the dataset from the data interface circuit, the dataset representing meaningful information,
electronically generate a first subset permutation based on a first subset of the dataset,
electronically generate a second subset permutation based on a second subset of the dataset, each subset of the dataset including a series of data elements having a particular fixed bit-length, the first subset permutation including a rearrangement of the series of data elements of the first subset, and the second subset permutation including a rearrangement of the series of data elements of the second subset,
form an electronic aggregation based on the first subset permutation and the second subset permutation, and
electronically generate an aggregation permutation based on the electronic aggregation, the aggregation permutation including a rearrangement of portions of the electronic aggregation, and the meaningful information being recoverable from the aggregation permutation; and
a data compression circuit coupled to the transform circuit, the data compression circuit being constructed and arranged to generate a compressed digital representation of the meaningful information based on the aggregation permutation;

wherein electronically generating the first subset permutation based on the first subset of the dataset includes:

parsing the first subset into a sequence of data elements which are M-bits in length, applying a transform involving lexicographic ordering to the sequence of data elements which are M-bits in length to form a first subset transform output, and obtaining a first subset entropy result which corresponds to the first subset transform output;

parsing the first subset into a sequence of data elements which are N-bits in length, applying the transform involving lexicographic ordering to the sequence of data elements which are N-bits in length to form a second subset transform output, and obtaining a second subset entropy result which corresponds to the second subset transform output, M and N being different integer values; and identifying the first subset transform output as the first subset permutation rather than the second subset transform output based on the first and second subset entropy results.

2. A computer program product for providing electronic access to a dataset; the computer program product including a non-transitory computer readable medium which stores instructions thereon; the instructions, when performed by a computerized device, causing the computerized device to:

electronically generate a first subset permutation based on a first subset of the dataset, electronically generate a second subset permutation based on a second subset of the dataset, the dataset representing meaningful information, each subset of the dataset including a series of data elements having a particular fixed bit-length, the first subset permutation including a rearrangement of the series of data elements of the first subset, and the second subset permutation including a rearrangement of the series of data elements of the second subset, form an electronic aggregation based on the first subset permutation and the second subset permutation, and electronically generate an aggregation permutation based on the electronic aggregation, the aggregation permutation including a rearrangement of portions of the electronic aggregation, and the meaningful information being recoverable from the aggregation permutation;

wherein electronically generating the first subset permutation based on the first subset of the dataset includes:

parsing the first subset into a sequence of data elements which are M-bits in length, applying a transform involving lexicographic ordering to the sequence of data elements which are M-bits in length to form a first subset transform output, and obtaining a first subset entropy result which corresponds to the first subset transform output;

parsing the first subset into a sequence of data elements which are N-bits in length, applying the transform involving lexicographic ordering to the sequence of data elements which are N-bits in length to form a second subset transform output, and obtaining a second subset entropy result which corresponds to the second subset transform output, M and N being different integer values; and identifying the first subset transform output as the first subset permutation rather than the second subset transform output based on the first and second subset entropy results.

3. A computer program product as in claim 2 wherein electronically generating the first subset permutation based on the first subset of the dataset includes deriving the first subset permutation from lexicographically sorted rotations of the series of data elements of the first subset; and wherein electronically generating the second subset permutation based on the second subset of the dataset includes deriving the second subset permutation from lexicographically sorted rotations of the series of data elements of the second subset.

4. A computer program product as in claim 3 wherein the instructions, when performed by the computerized device, further cause the computerized device to:

prior to electronically generating the subset permutations, receive the dataset from a data interface circuit and divide the dataset into a series of equal-sized dataset segments, each subset of the dataset being one of the equal-sized dataset segments in the series.

5. A computer program product as in claim 4 wherein forming the electronic aggregation based the first subset permutation and the second subset permutation includes:

partitioning each subset permutation into sections and concatenating the sections in an interleaved manner to form the electronic aggregation.

6. A computer program product as in claim 2 wherein electronically generating the second subset permutation based on the second subset of the dataset includes:

parsing the second subset into a sequence of data elements which are M-bits in length, applying the transform involving lexicographic ordering to the sequence of data elements which are M-bits in length to form the second subset permutation.

7. A computer program product as in claim 6, wherein electronically generating the aggregation permutation based on the electronic aggregation includes:

parsing the electronic aggregation into a sequence of data elements which are M-bits in length, applying the transform involving lexicographic ordering to the sequence of data elements which are M-bits in length to form the aggregation permutation;

wherein the first subset entropy results include a first subset entropy value and the second subset entropy results include a second subset entropy value;

wherein identifying the first subset transform output as the first subset permutation rather than the second subset transform output based on the first and second subset entropy results includes:

comparing the first subset entropy value and the second subset entropy value, the first subset entropy value being less than the second subset entropy value; and wherein the instructions, when performed by the computerized device, further cause the computerized device to:

reconstruct the electronic aggregation from the aggregation permutation based on first subset entropy results, and reconstruct the dataset from the electronic aggregation based on first subset entropy results.

8. A computer program product as in claim 2 wherein electronically generating the aggregation permutation based on the electronic aggregation includes:

parsing the electronic aggregation into a sequence of data elements which are M-bits in length, applying the transform involving lexicographic ordering to the sequence of data elements which are M-bits in length to form the aggregation permutation.

9. A computer program product as in claim 2 wherein electronically generating the aggregation permutation based on the electronic aggregation includes:
   parsing the electronic aggregation into a sequence of data elements which are X-bits in length, applying the transform involving lexicographic ordering to the sequence of data elements which are X-bits in length to form a first aggregation transform output, and obtaining a first aggregation entropy result which corresponds to the first aggregation transform output;
   parsing the electronic aggregation into a sequence of data elements which are Y-bits in length, applying the transform involving lexicographic ordering to the sequence of data elements which are Y-bits in length to form a second aggregation transform output, and obtaining a second aggregation entropy result which corresponds to the second aggregation transform output, X and Y being different integer values; and
   identifying the first aggregation transform output as the aggregation permutation rather than the second aggregation transform output based on the first and second aggregation entropy results.

10. A computer program product as in claim 2 wherein forming the electronic aggregation based on the first subset permutation and the second subset permutation includes:
   partitioning the first subset permutation into ordered first subset sections,
   partitioning the second subset permutation into ordered second subset sections, and
   aggregating like-order first subset sections with like-order second subset sections.

11. A computer program product as in claim 10 wherein partitioning the first subset permutation into the ordered first subset sections includes dividing the first subset permutation into a front-half first subset section and a back-half first subset section;
   wherein partitioning the second subset permutation into the ordered second subset sections includes dividing the second subset permutation into a front-half second subset section and a back-half second subset section; and
   wherein aggregating like-order first subset sections with like-order second subset sections includes (i) positioning the front-half second subset section immediately after the front-half first subset section and (ii) positioning the back-half second subset section immediately after the back-half first subset section when forming the electronic aggregation.

12. A computer program product as in claim 11 wherein electronically generating the aggregation permutation based on the electronic aggregation includes:
   parsing the electronic aggregation into a sequence of data elements, and
   applying a transform involving lexicographic ordering to the sequence of data elements to form the aggregation permutation.

13. A computer program product as in claim 2, wherein the instructions, when performed by the computerized device, further cause the computerized device to:
   receive another dataset;
   electronically generate another first subset permutation based on a first subset of the another dataset,
   electronically generate another second subset permutation based on a second subset of the another dataset, the dataset representing further meaningful information, each subset of the another dataset including a series of data elements having a particular fixed bit-length of M bits, the another first subset permutation including a rearrangement of the series of data elements of the first subset of the another dataset, and the another second subset permutation including a rearrangement of the series of data elements of the second subset of the another dataset,
   form another electronic aggregation based on the another first subset permutation and the another second subset permutation, and
   electronically generate another aggregation permutation based on the another electronic aggregation, the another aggregation permutation including a rearrangement of portions of the another electronic aggregation, and the further meaningful information being recoverable from the another aggregation permutation.

14. A computer program product as in claim 2, wherein electronically generating the first subset permutation based on the first subset of the dataset further includes:
   not identifying the second subset transform output as the first subset permutation.

15. In an electronic system, a method of providing electronic access to a dataset, the method comprising:
   electronically generating, by transform circuitry of the electronic system, a first subset permutation based on a first subset of the dataset;
   electronically generating, by the transform circuitry, a second subset permutation based on a second subset of the dataset, the dataset representing meaningful information, each subset of the dataset including a series of data elements having a particular fixed bit-length, the first subset permutation including a rearrangement of the series of data elements of the first subset, and the second subset permutation including a rearrangement of the series of data elements of the second subset;
   forming, by aggregation circuitry of the electronic system, an electronic aggregation based on the first subset permutation and the second subset permutation; and
   electronically generating, by the transform circuitry, an aggregation permutation based on the electronic aggregation, the aggregation permutation including a rearrangement of portions of the electronic aggregation, and the meaningful information being recoverable from the aggregation permutation;
   wherein electronically generating the first subset permutation based on the first subset of the dataset includes:
      parsing the first subset into a sequence of data elements which are M-bits in length, applying a transform involving lexicographic ordering to the sequence of data elements which are M-bits in length to form a first subset transform output, and obtaining a first subset entropy result which corresponds to the first subset transform output;
      parsing the first subset into a sequence of data elements which are N-bits in length, applying the transform involving lexicographic ordering to the sequence of data elements which are N-bits in length to form a second subset transform output, and obtaining a second subset entropy result which corresponds to the second subset transform output, M and N being different integer values; and
      identifying the first subset transform output as the first subset permutation rather than the second subset transform output based on the first and second subset entropy results.

16. A method as in claim 15 wherein electronically generating the first subset permutation based on the first subset of the dataset includes deriving the first subset permutation from lexicographically sorted rotations of the series of data elements of the first subset; and wherein electronically generating the second subset permutation based on the second subset of the dataset includes deriving the second subset permutation from lexicographically sorted rotations of the series of data elements of the second subset.

17. A method as in claim 16, further comprising:

prior to electronically generating the subset permutations, receiving the dataset from a data interface circuit coupled to the transform circuitry, and dividing the dataset into a series of equal-sized dataset segments, each subset being one of the equal-sized dataset segments in the series.

18. A method as in claim 15 wherein the electronic system further includes a data compression engine having compression circuitry to compress data; and wherein the method further comprises:

obtaining, from the data compression engine, a compressed digital representation of the meaningful information based on the aggregation permutation.

19. A method as in claim 18 wherein the compression circuitry of the data compression engine includes a series of compression circuits having a move-to-front circuit, a run-length encoding circuit, and an entropy encoding circuit; and wherein obtaining the compressed digital representation of the meaningful information based on the aggregation permutation includes acquiring the compressed digital representation in response to inputting the aggregation permutation into the series of compression circuits.

20. A method as in claim 19 wherein the data compression engine, the transform circuitry and the aggregation circuitry reside on a local device of the electronic system; and wherein the method further comprises:

transferring the compressed digital representation from the local device to a remote device over a communications medium, and recovering, within the remote device, the meaningful information from the compressed digital representation.

21. A method as in claim 19 wherein the data compression engine resides on a storage control circuit of the electronic system; and wherein the method further comprises:

writing the compressed digital representation from the storage control circuit to non-volatile memory, and at a later time, reading the compressed digital representation from the non-volatile memory and recovering the meaningful information from the compressed digital representation.

22. A method as in claim 19 wherein the dataset and another dataset form portions of an electronic data file; and wherein the method further comprises:

while obtaining the compressed digital representation of the meaningful information based on the aggregation permutation, transforming the other dataset to form another aggregation permutation within the electronic system in a pipelined transform/compression processing manner.

* * * * *